United States Patent [19]
Doke et al.

[11] Patent Number: 5,315,830
[45] Date of Patent: May 31, 1994

[54] MODULAR THERMOELECTRIC ASSEMBLY

[75] Inventors: Michael J. Doke, Dallas; Richard A. Howarth, Allen; Leonard J. Recine, Sr., Plano, all of Tex.

[73] Assignee: Marlow Industries, Inc., Dallas, Tex.

[21] Appl. No.: 47,695

[22] Filed: Apr. 14, 1993

[51] Int. Cl.$^5$ .............................................. F25B 21/02
[52] U.S. Cl. ...................................... 62/3.2; 62/3.6; 62/3.7
[58] Field of Search ................ 62/3.2, 3.3, 3.4, 3.6, 62/3.62, 3.7

[56] References Cited

U.S. PATENT DOCUMENTS

| | | | |
|---|---|---|---|
| 3,823,567 | 7/1974 | Corini | 62/3 |
| 4,326,383 | 4/1982 | Reed et al. | 62/3.2 |
| 4,472,945 | 9/1984 | Cech et al. | 62/3.3 |
| 4,726,193 | 2/1988 | Burke et al. | 62/3 |
| 5,209,069 | 5/1993 | Newman | 62/3.64 |

FOREIGN PATENT DOCUMENTS 320580  1/1991  Japan ..................... 62/3.2

*Primary Examiner*—John M. Sollecito
*Attorney, Agent, or Firm*—Baker & Botts

[57] ABSTRACT

A modular thermoelectric assembly is provided to maintain the temperature within a container or enclosed structure at a desired level. The thermoelectric assembly includes a thermoelectric device with a hot sink and a cold sink. A layer of insulating material is disposed between the hot sink and the cold sink. The hot sink and the insulating material are used to install the thermoelectric assembly into an appropriately sized opening extending through the exterior of the container or enclosed structure. A thermoelectric device, contained within the layer of insulating material, functions as a heat pump to transfer heat between the cold sink and the hot sink. An electrical motor, rotating shaft and propellers are carried by the assembly to assist in the circulation of air to improve the efficiency of the cold sink and the hot sink.

21 Claims, 2 Drawing Sheets

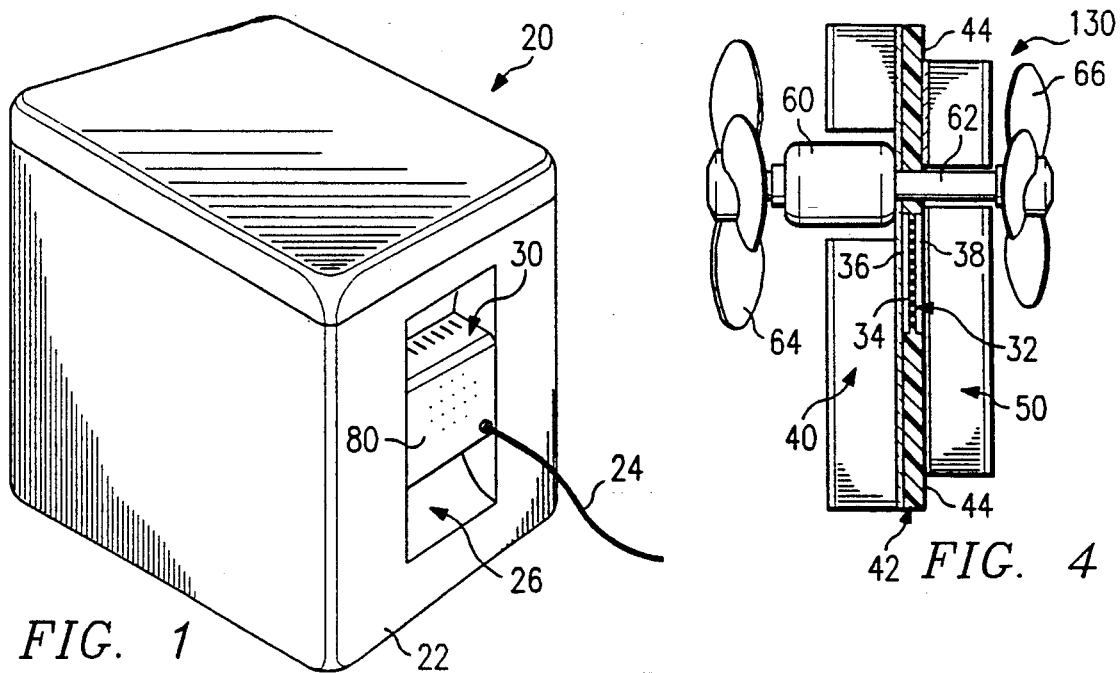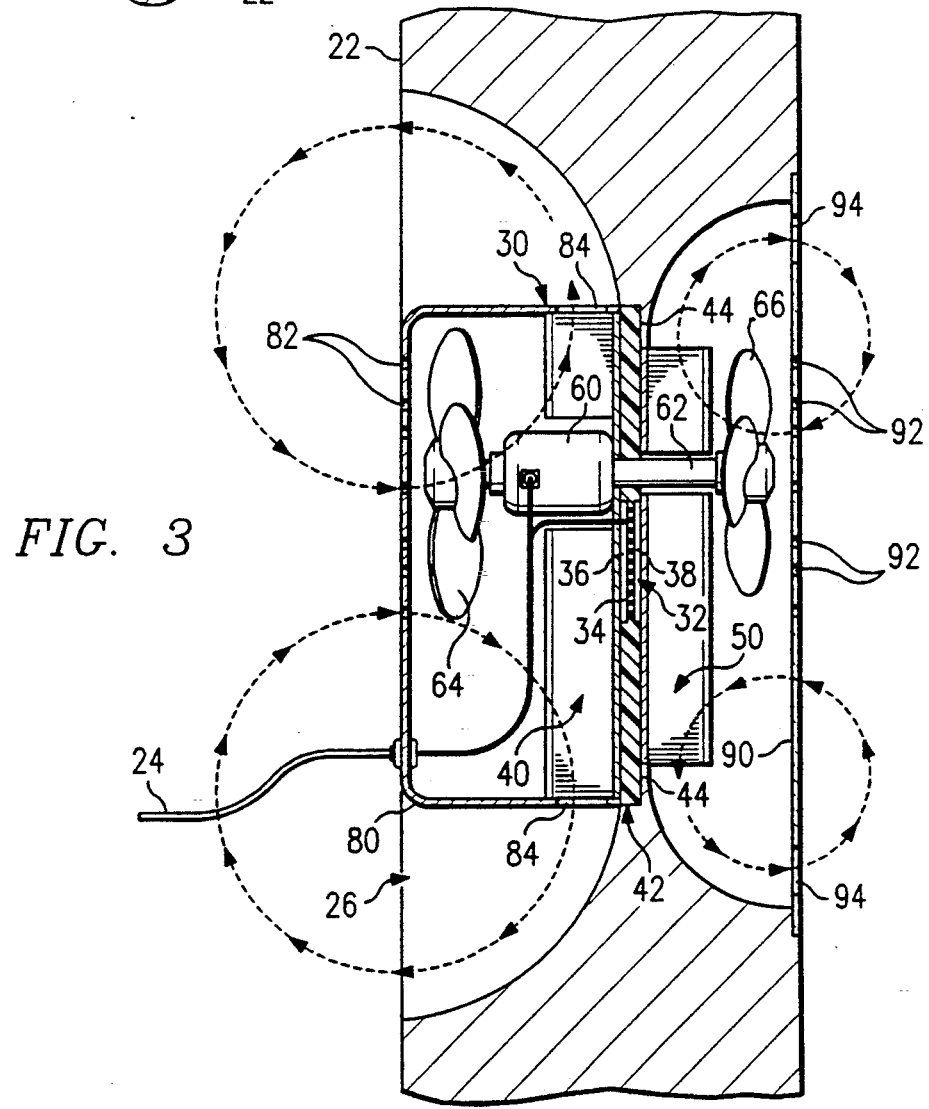

MODULAR THERMOELECTRIC ASSEMBLY

TECHNICAL FIELD OF THE INVENTION

This invention relates to thermoelectric devices and more particularly to the use of a thermoelectric assembly to maintain the temperature of a container, box, or any other type of enclosed structure within a desired temperature range.

BACKGROUND OF THE INVENTION

The basic theory and operation of thermoelectric devices has been developed for many years. Modern thermoelectric devices typically include an array of thermocouples which operate by using the Peltier effect. Thermoelectric devices are essentially small heat pumps which follow the laws of thermodynamics in the same manner as mechanical heat pumps, refrigerators, or any other apparatus used to transfer heat energy. The principal difference is that thermoelectric devices function with solid state electrical components (thermocouples) as compared to more traditional mechanical/fluid heating and cooling components.

When DC electrical power is applied to a thermoelectric device having an array of thermocouples, heat is absorbed on the cold side of the thermocouples and passes through the thermocouples and is dissipated on the hot side of the thermocouples. A heat sink (sometimes referred to as the "hot sink") is preferably attached to the hot side of the thermoelectric device to aid in dissipating heat from the thermocouples to the adjacent environment. In a similar manner a heat sink (sometimes referred to as a "cold sink") is often attached to the cold side of the thermoelectric device to aid in removing heat from the adjacent environment. Thermoelectric devices are sometimes referred to as thermoelectric coolers. However, since they are a type of heat pump, thermoelectric devices can function as either a cooler or a heater.

There are a wide variety of containers and enclosed structures which are designed to be maintained within a selected temperature range. Examples of such containers and enclosed structures include, but are not limited to, "ice chests", picnic coolers, cabinets containing sensitive electronic equipment, and organ transplant containers. The use of thermoelectric devices which operate on a 12-volt DC system are well known to maintain desired operating temperatures in portable refrigerators or cooler associated with various types of motor vehicles. An example of a container having a thermoelectric cooler is shown in U.S. Pat. No. 4,726,193 entitled "Temperature Controlled Picnic Box". This patent is incorporated by reference for all purposes within this application.

SUMMARY OF THE INVENTION

In accordance with the present invention, disadvantages and problems associated with previous thermoelectric assemblies used to maintain selected temperatures in an enclosed structure or container have been substantially reduced or eliminated.

A modular thermoelectric assembly including a thermoelectric device along with two associated heat sinks (sometimes referred to as the hot sink and the cold sink) are provided for installment in a container or enclosed structure. A layer of insulating material is disposed between the hot sink and the cold sink. Depending upon whether the thermoelectric assembly will be used to raise or lower the temperature within the enclosed structure, either the hot sink or the cold sink is positioned within the enclosed structure and the other heat sink is positioned outside the enclosed structure. If desired for some applications, the polarity of this electrical power supplied to the thermoelectric device may be reversed to reverse the function of the hot sink and the cold sink.

In accordance to one aspect of the present invention, a modular thermoelectric assembly is provided with a thermoelectric device having a first heat sink secured to the hot side of the thermoelectric device (hot sink) and a second heat sink secured to the cold side of the thermoelectric device (cold sink). A layer of insulating material is disposed between the hot sink and the cold sink with the thermoelectric device contained within the insulating layer. An electrical motor may be secured to either the hot sink or the cold sink with a rotating shaft extending through the electrical motor and both the hot sink and the cold sink. Propellers are provided on each end of the rotating shaft to assist with the circulation of air relative to the respective hot sink and cold sink. If the modular thermoelectric assembly will be used to lower the temperature of the associated container, the hot sink is positioned exterior from the container with the electrical motor preferably attached thereto. If the thermoelectric assembly is used as a heater, the hot sink and attached electrical motor will preferably be positioned within the container.

A significant technical advantage of the present invention is that the modular thermoelectric assembly may be used with a wide variety of containers, boxes and other types of enclosed structures. By modifying the geometric configuration of the hot sink, cold sink, and the layer of insulating material disposed between the hot sink and the cold sink, the modular thermoelectric assembly may be installed into any container, box or other enclosed structure having an opening with a corresponding geometric configuration. The modular thermoelectric assembly may be installed after the container or enclosed structure has been fabricated without requiring access to the interior of the container or enclosed structure.

Another important technical advantage of the present invention results from placing the layer of insulating material between the hot sink and the cold sink with the thermoelectric device disposed within the insulating layer and an electrical motor with its rotating shaft secured to either the hot sink or the cold sink as desired. By securing the electrical motor with either the hot sink or cold sink and extending the rotating shaft through the hot sink, the insulating layer and the cold sink, a compact modular assembly is provided which may be installed within a relatively small opening in the selected container. The present invention allows reducing the size of the opening in the container to the minimum required to receive the heat sink which will be positioned within the container. The present invention eliminates the need for any additional openings into the container for installation of the electrical motor and/or rotating shaft.

A further technical advantage of the present invention results from attaching the electrical motor to one of the heat sinks and extending a rotating shaft through the electrical motor, both heat sinks and the insulating material. This configuration allows attachment of propellers on each end of the rotating shaft adjacent to the respective heat sinks to significantly improve air flow over the respective heat sinks. By improving the air flow, the efficiency of the respective heat sinks is increased which allows the size of the heat sinks to be reduced and/or the cooling and heating capacity of the thermoelectric assembly to be increased.

Another significant technical advantage of the present invention results from positioning an electrical motor and associated propeller or fan adjacent to a thermoelectric device. This arrangement allows the propeller to force air to impinge directly on heat transfer surfaces associated with the thermoelectric device. By forcing air to flow directly over these surfaces, the efficiency of the thermoelectric device is substantially increased.

BRIEF DESCRIPTION OF THE DRAWINGS

For a more complete understanding of the present invention, and the advantages thereof, reference is now made to the following written description taken in conjunction with the accompanying drawings, in which:

FIG. 1 is an isometric drawing of a container or enclosed structure having a modular thermoelectric assembly incorporating the present invention;

FIG. 3 is a schematic drawing in section and in elevation with portions broken away, showing the modular thermoelectric assembly of FIG. 2 with the preferred air flow paths; and FIG. 4 is a drawing in elevation and in section showing a modular thermoelectric assembly incorporating the present invention.

DETAILED DESCRIPTION OF THE INVENTION

Figure 2:
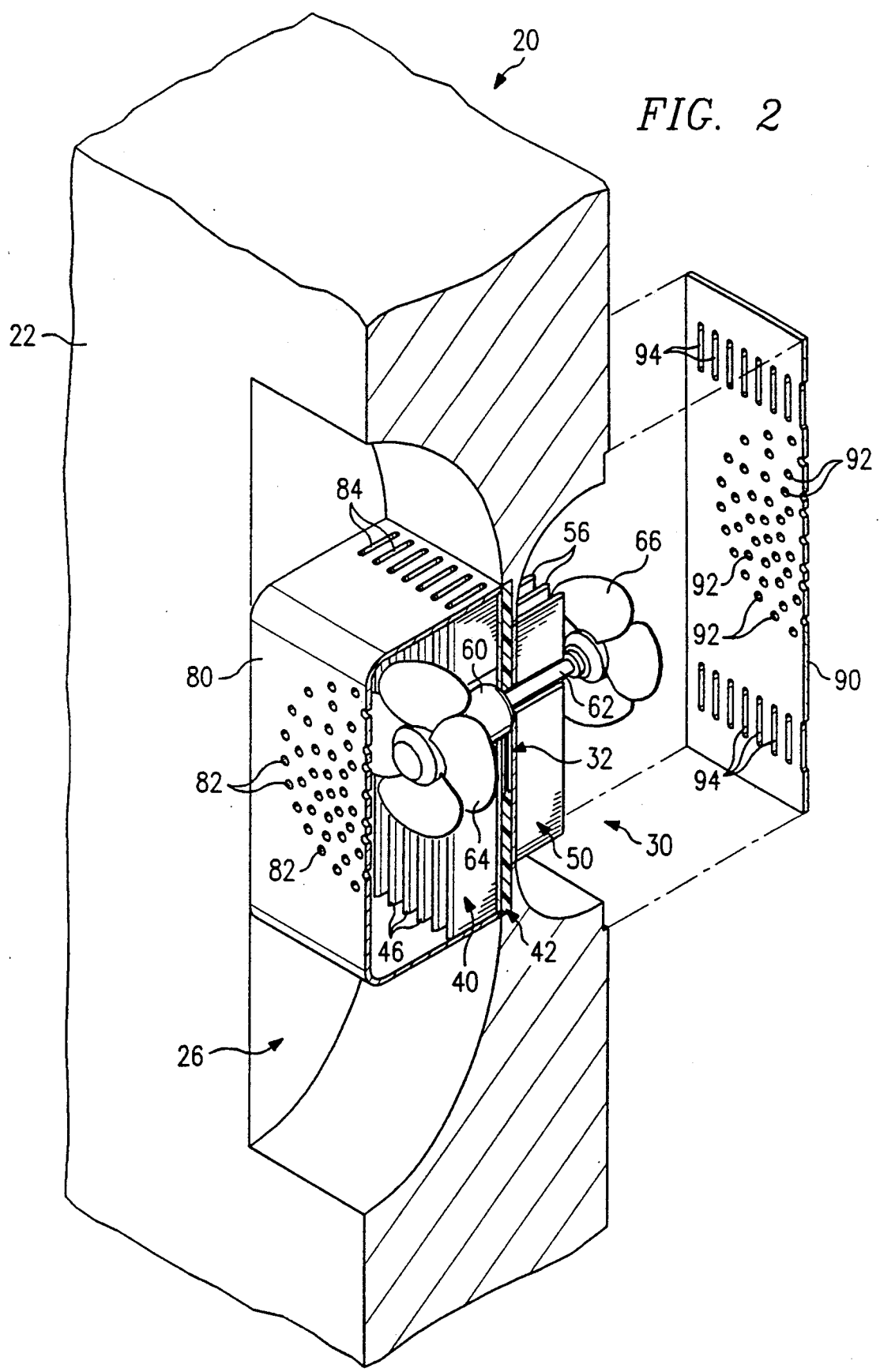
FIG. 2 is an enlarged isometric drawing, in section and in elevation with portions broken away, of the modular thermoelectric assembly and container of FIG. 1.

The preferred embodiments of the present invention and its advantages are best understood by referring to FIGS. 1 through 4 of the drawings, like numerals being used for like and corresponding parts of the various drawings.

As shown in FIG. 1, container or enclosed structure 20 includes modular thermoelectric assembly 30 disposed within end 22 of container 20. Container 20 could be any type of enclosed structure such as an ice chest, picnic cooler, cabinet for electronic equipment, pharmaceutical storage, organ transplant container, etc. Container 20 may be a permanently mounted enclosure in a building or in a motor vehicle such as an automobile or airplane, or a hand carried portable container. An important feature of the present invention is the ability to modify thermoelectric assembly 30 for use with any type of enclosed structure or container.

Thermoelectric assembly 30 includes thermoelectric device 32 with first heat sink 40 and second heat sink 50 disposed on opposite sides thereof. Thermoelectric device 32 preferably includes a plurality of thermocouples or thermoelectric elements 34 disposed between thermally conductive plates 36 and 38. For some applications, plates 36 and 38 may be formed from ceramic and/or composite materials as desired. Thermoelectric elements 34 may be selected from materials such as bismuth telluride to provide an array of P-N junctions with the desired thermoelectric characteristics to allow thermoelectric device 32 to function as a heat pump.

Thermoelectric elements 34 are preferably connected electrically in series and thermally in parallel by plates 36 and 38. Conductor or electrical power cord 24 is provided to supply electrical energy from a 12 volt DC power supply (not shown). The power supply can be a battery, DC power generator, AC/DC converter, or any other appropriate source of DC electrical power. When DC electrical power is supplied to thermoelectric device 34, heat is absorbed on the cold side represented by plate 38 and passes through thermoelectric elements or thermocouples 34 and is dissipated on the hot side at plate 36.

The efficiency of thermoelectric device 32 is substantially improved by attaching first heat sink 40 to hot plate 36 and second heat sink 50 to cold plate 38. Since heat sink 40 is attached to hot plate 36, it is sometimes referred to as the hot sink. In the same manner, since heat sink 50 is attached to cold plate 38, it is sometimes referred to as the cold sink. Appropriate bonding techniques such as soldering (not shown) may be used to assemble ceramic plates 36 and 38 with thermoelectric elements 34 disposed therebetween. Appropriately sized bolts and screws (not shown) may be used to assemble heat sinks 40 and 50 with thermoelectric device 32 disposed therebetween.

Heat sinks 40 and 50 are shown as fin type exchangers extruded as a single unit from appropriate material such as aluminum or copper. Heat sinks 40 and 50 could be manufactured from other types of material having the desired thermal conductivity and strength characteristics. In addition, other heat exchangers designs such as pin fin, slotted fin heat or fin welded heat sinks could be used in place of the single unit extruded heat sinks shown in FIGS. 2, 3 and 4.

Layer 42 of appropriate insulating material such as neoprene foam, polystyrene, polyurethane or cork is disposed between heat sinks 40 and 50. For many applications, neoprene foam is the preferred material for insulating layer 42. Heat sink 40 and insulating layer 42 cooperate to provide means for installing modular thermoelectric assembly 30 within an appropriately sized opening into enclosed structure 20. Since heat sink 40 is generally designed to have a larger surface area than cold sink 50, portion 44 of insulating material 42 extends beyond the periphery of heat sink 50 to form a flange suitable for engagement with opening 26 in container 20.

Heat sink 40 insulating layer 42 and heat sink 50 are shown in FIGS. 1 through 4 as having a generally rectangular cross-section. Opening 26 which extends through end 22 of container 20 includes a similar rectangular configuration for engagement with portion 44 on the periphery of insulating material 42. An important feature of the present invention is that heat sink 40, insulating layer 42 and heat sink 50 may be modified to have any geometric configuration such as circular, oval or triangular as appropriate for the specific container or enclosed structure in which modular thermoelectric assembly 30 will be installed.

The present invention allows optimizing the geometric configuration of the thermoelectric assembly to reduce costs of installation within a selected container or enclosed structure while at the same time enhancing the cooling/heating efficiency of thermoelectric device 32. The present invention allows maximizing the efficiency of the hot sink and/or the cold sink depending upon the application in which the thermoelectric assembly will be used. For some applications, hot sink 40 may be positioned within the enclosed structure and cold sink 50 on the exterior. For other applications, the polarity of the electrical power supplied to thermoelectric device 32 may be reversed to reverse the function of hot sink 40 and cold sink 50. Therefore, a thermoelectric assembly incorporating the present invention may be installed into an enclosed structure or container without having access to the interior of the enclosed structure or container to either cool or heat the interior.

Heat sink 40 and insulating layer 42 cooperate to function as structural support for thermoelectric assembly 30 within opening 26. Insulating layer 42 also functions as a gasket to form a fluid barrier between heat sink 40 and opening 26. Insulating layer 42 also provides a vapor barrier to block opening 26 and prevent undesired air flow therethrough.

Electrical motor 60 is preferably secured to first heat sink 40. Electrical conductor 24 is used to supply power to electrical motor 60. Rotating shaft 62 preferably extends through electric motor 60, heat sink 40, insulating layer 42 and heat sink 50. Seals (not shown) may be provided between the exterior of rotating shaft 62 and the adjacent portions of insulating layer 42 to prevent undesired air flow along shaft 62. Propeller 64 is attached to the end of rotating shaft 62 extending from heat sink 40. Propeller 66 is attached to the other end of shaft 62 extending from heat sink 50. By positioning propeller 64 adjacent to its associated heat sink 40 and propeller 66 adjacent to its associated heat sink 50, the circulation of air over the respective heat sinks is substantially increased which results in improved efficiency of heat sinks 40, 50 and thermoelectric device 32.

Modular thermoelectric assembly 30 preferably includes cover 80 attached to heat sink 40 and cover 90 disposed over heat sink 50. A plurality of holes 82 are provided in the center of cover 80 and a plurality of holes 92 are provided in the center of cover 90. A plurality of longitudinal slots 84 are provided at each end of cover 80 on opposite sides of holes 82. In the same manner, a plurality of longitudinal slots 94 are provided at each end of cover 90 on opposite sides of holes 92. The rotation of shaft 62 and the orientation of the blades carried by propellers 64 and 66 are selected such that when shaft 62 is rotated by electrical motor 60, air will be drawn inwardly through holes 82 in cover 80 and holes 92 in cover 90. The air is exhausted from slots 84 at each end of cover 80 and slots 94 at each end of cover 90. Slots 84 are preferably aligned with fins 46 of heat exchanger 40. Thus electrical motor 60 rotating shaft 62, propellers 64 and 66 cooperate with covers 80 and 90 to provide the optimum air circulation flow path with respect to fins 46 of heat sink 40 and fins 56 of heat sink 50. The preferred air circulation flow path is shown in FIG. 3 of the drawings. A portion of the air flow path is generally normal to the heat transfer surfaces associated with heat sinks 40 and 50 and hot side 36 and cold side 38 respectively. Another portion of the air flow path is parallel with fins 46 and 56 of heat sinks 40 and 50 respectively. Insulating layer 42 cooperates with heat sink 40 and opening 26 to prevent undesired mixing of the air circulated by propellers 64 and 66 respectively.

A thermoelectric assembly incorporating the present invention can function satisfactorily without covers 80 and/or 90. The use of covers 80 and/or 90 enhances the efficiency of the assembly. Modular thermoelectric assembly 130 is shown in FIG. 4 without covers 80 and 90.

As shown in FIGS. 2, 3 and 4, electrical motor 60 and rotating shaft 62 are preferably disposed adjacent to thermoelectric device 32. This location for electrical motor 60 and rotating shaft 62 allows propellers 64 and 66 to force air to directly contact heat the transfer surfaces associated with hot side 36 and cold side 38 of thermoelectric device 32. This direct impingement of air, particularly from propeller 64 onto the heat transfer surfaces associated with hot plate 36, has substantially increased the efficiency of thermoelectric device 32.

For some applications, it may not be required to install both propellers 64 and 66. Depending upon the amount of heat which will be transferred by the specific modular thermoelectric assembly, either propeller 64 or 66 may be eliminated. Also, impellers could be used to replace propellers 64 and/or 66 if desired. For some applications, electrical motor 60 and rotating shaft 62 may not be required. For these applications, the natural convection of air over heat sinks 40 and 50 would be used to provide the desired heat transfer with the surrounding environment.

Since the present invention results in a compact modular thermoelectric assembly of heat sinks, insulating material, thermoelectric device, electrical motor and propellers, the modular thermoelectric assembly may be installed on the top, bottom, side, front or any other desired portion of an enclosed structure or container. The only requirement is that the opening in the container have a geometric configuration which matches the configuration of the heat sinks and insulating layer used to manufacture the specific thermoelectric assembly. Also, the present invention may be used with other DC power supplies and is not limited to 12 volt DC power.

Although the present invention and its advantages have been described in detail, it should be understood that various changes, substitutions and alterations can be made without departing from the spirit and scope of the invention as defined by the following claims.

What is claimed is:

1. Apparatus for controlling the temperature within an enclosed structure comprising:
   a thermoelectric device with a first heat sink disposed on one side of the device and a second heat sink disposed on the other side of the device;
   a layer of insulating material disposed between the first heat sink and the second heat sink with the thermoelectric device contained within the insulating material;
   an electrical motor carried by the first heat sink;
   a rotating shaft extending longitudinally through the first heat sink, the electrical motor, the insulating material and the second heat sink; and
   a propeller attached to each end of the rotating shaft adjacent to the first heat sink and the second heat sink respectively.

2. The apparatus as defined in claim 1 further comprising:
   the first heat sink having a cross-sectional area larger than the cross-sectional area of the second heat sink; and
   the first heat sink and the insulating material cooperating with each other to provide means for installing the apparatus into the enclosed structure.

3. The apparatus as defined in claim 1 further comprising:
   the thermoelectric device having a hot side and a cold side; and the first heat sink attached tot he hot side of the thermoelectric device and the second heat sink attached to the cold side of the thermoelectric device.

4. The apparatus as defined in claim 1 further comprising:
the thermoelectric device having a cold side;
the second heat sink attached to the cold side of the thermoelectric device; and
the second heat sink disposed within the enclosed structure.

5. The apparatus as defined in claim 1 further comprising:
the thermoelectric device having a hot side;
the first heat sink attached to the hot side of the thermoelectric device; and
the first heat sink disposed within the enclosed structure.

6. The apparatus as defined in claim 1 wherein the insulating material is selected from the group comprising neoprene foam, polystyrene, polyurethane or cork.

7. The apparatus as defined in claim 1 further comprising a cover disposed over at least one of the heat sinks to guide the circulation of air with respect to the heat sink.

8. A modular thermoelectric assembly for installation into a container comprising:
a thermoelectric device for controlling the temperature within the container;
the thermoelectric device having a hot side and a cold side;
a first heat sink and a second heat sink attached to the hot side and the cold side respectively;
a layer of insulating material disposed between the first heat sink and the second heat sink with the thermoelectric device contained within the insulating material;
the layer of insulating material and the first heat sink sized to engage an opening in the container and couple the modulas thermoelectric assembly to the container for installation of the modular thermoelectric assembly as a complete unit;
an electrical motor attached to one of the heat sinks with a rotating shaft extending longitudinally through the electrical motor and both heat sinks; a propeller attached to each end of the rotating shaft; and the propellers disposed adjacent to the respective heat sinks.

9. The modular thermoelectric assembly as defined in claim 8 further comprising:
an electric motor attached to one of the heat sinks with a shaft extending therefrom; and
a propeller secured to the shaft for circulation of air relative to the heat sink.

10. The modular thermoelectric assembly as defined in claim 8 further comprising:
a first cover attached to the first heat sink and a second cover disposed over the second heat sink;
a plurality of holes extending through the center portion of each cover;
a plurality of longitudinal slots adjacent to the ends of each cover on opposite sides of the holes; and
the cover associated with each heat sink and its respective propeller cooperating to establish the preferred air circulation flow path for each heat sink.

11. The modular thermoelectric assembly as defined in claim 8 further comprising the insulating material selected from the group consisting of neoprene foam, polystyrene, polyurethane, or cork.

12. The modular thermoelectric assembly as defined in claim 8 further comprising the heat sinks selected from the group consisting of extruded heat exchangers, pin type heat exchangers, slotted fin heat exchangers, or folded fin type heat exchangers.

13. The modular thermoelectric assembly as defined in claim 8 further comprising means for circulating air with respect to the heat sinks.

14. The modular thermoelectric assembly as defined in claim 8 further comprising the second heat sink disposed within the container.

15. The modular thermoelectric assembly as defined in claim 8 further comprising the first heat sink disposed within the container.

16. A modular thermoelectric assembly for installation into a container comprising:
a thermoelectric device for controlling the temperature within the container;
the thermoelectric device having a hot side and a cold side;
a first heat sink and a second heat sink attached to the hot side and the cold side respectively;
a layer of insulating material disposed between the first heat sink and the second heat sink with the thermoelectric device contained within the insulating material;
the layer of insulating material and the first heat sink sized to engage an opening in the container for installation of the thermoelectric assembly; and
an air circulation device for circulating air with respect to the heat sinks comprising a shaft extending through an electrical motor with a propeller on each and thereof.

17. The modular thermoelectric assembly as defined in claim 16 further comprising the electrical motor disposed within the first heat sink and the rotating shaft extending longitudinally through the first heat sink, the electric motor, the insulating material and the second heat sink.

18. A thermoelectric assembly comprising:
a thermoelectric device for controlling temperature;
the thermoelectric device having a hot side and a cold side heat transfer surfaces;
a first heat sink with a first heat transfer surface attached to the hot side and a second heat sink with a second heat transfer surface attached to the cold side;
a layer of insulating material disposed between the first heat sink and the second heat sink with the thermoelectric device contained within the insulating material; and
an air circulation device simultaneously directing air to circulate in a first flow path directly impinging upon the first heat transfer surface and a second flow path directly impinging upon the second heat transfer surface.

19. The thermoelectric assembly as defined in claim 18 further comprising:
an electrical motor attached to the first heat sink with a rotating shaft extending from the electrical motor;
a propeller secured to the rotating shaft for circulation of air relative to the first heat sink; and
the electrical motor propeller and rotating shaft positioned adjacent to the thermoelectric device whereby the propeller forces air circulation normal to the heat transfer surfaces associated with the hot side of the thermoelectric device.

20. The thermoelectric assembly as defined in claim 18 further comprising a first portion of the air flow path approximately normal to the heat transfer surfaces and a second portion of the air flow path approximately parallel with the heat transfer surfaces.

21. The modular thermoelectric assembly as defined in claim 18 further comprising:

a first cover attached tot he first heat sink and a second cover disposed over the second heat sink;
a plurality of holes extending through the center portion of each cover;
a plurality of longitudinal slots adjacent to the ends of each cover on opposite sides of the holes; and
the cover associated with each heat sink and its respective propeller cooperating to establish the preferred air circulation flow path for each heat sink.

* * * * *

REEXAMINATION CERTIFICATE (3477th)

United States Patent [19]
Doke et al.

[11] B1 5,315,830
[45] Certificate Issued Apr. 7, 1998

[54] MODULAR THERMOELECTRIC ASSEMBLY

[75] Inventors: Michael J. Doke, Dallas; Richard A. Howarth, Allen; Leonard J. Recine, Sr., Plano, all of Tex.

[73] Assignee: Marlow Industries, Inc., Dallas, Tex.

Reexamination Request:
No. 90/004,040, Nov. 28, 1995

Reexamination Certificate for:
Patent No.: 5,315,830
Issued: May 31, 1994
Appl. No.: 47,695
Filed: Apr. 14, 1993

[51] Int. Cl.⁶ .................................... F25B 21/02
[52] U.S. Cl. .................... 62/3.2; 62/3.6; 62/3.7
[58] Field of Search .................. 62/3.2, 3.3, 3.6, 62/3.7, 262, 404, 426, 419

[56] References Cited

U.S. PATENT DOCUMENTS

| | | | |
|---|---|---|---|
| 2,837,899 | 6/1958 | Lindenblad | 62/1 |
| 2,872,788 | 2/1959 | Lindenblad | 62/3 |
| 2,932,953 | 4/1960 | Becket et al. | 62/3 |
| 3,048,020 | 8/1962 | Jones | 62/3 |
| 3,077,079 | 2/1963 | Pietsch | 62/3 |
| 3,177,670 | 4/1965 | Boehmer et al. | 62/3 |
| 3,177,671 | 4/1965 | Stambaugh | 62/3 |
| 3,280,573 | 10/1966 | Brown et al. | 62/3 |
| 3,906,741 | 9/1975 | Terry | 62/262 |
| 4,007,600 | 2/1977 | Simms | 2/3 |
| 4,328,676 | 5/1982 | Reed | 62/3 |
| 4,346,562 | 8/1982 | Beitner | 62/3 |
| 4,627,242 | 12/1986 | Beitner | 62/3 |
| 4,644,753 | 2/1987 | Burke | 62/3 |
| 4,662,180 | 5/1987 | Menocal | 62/3 |
| 4,847,666 | 7/1989 | Heremans et al. | 357/16 |
| 4,934,150 | 6/1990 | Fessler | 62/59 |
| 5,029,446 | 7/1991 | Suzuki | 62/3.6 |
| 5,168,339 | 12/1992 | Yokotani et al. | 257/64 |
| 5,301,508 | 4/1994 | Kahl et al. | 62/3.62 |
| 5,367,879 | 11/1994 | Doke et al. | 62/3 |

FOREIGN PATENT DOCUMENTS

| | | | |
|---|---|---|---|
| 2797689 | 4/1992 | Australia. | |
| 0342165 | 1/1989 | European Pat. Off.. | |
| 2432693 | 10/1980 | France | F25D 17/04 |
| 2501349 | 9/1982 | France. | |
| 1125957 | 12/1962 | Germany. | |
| 1198837 | 7/1965 | Germany. | |
| 8101739 | 2/1981 | WIPO | F25B 21/02 |
| 8504948 | 7/1985 | WIPO | F25B 21/02 |

*Primary Examiner*—John Sollecito

[57] ABSTRACT

A modular thermoelectric assembly is provided to maintain the temperature within a container or enclosed structure at a desired level. The thermoelectric assembly includes a thermoelectric device with a hot sink and a cold sink. A layer of insulating material is disposed between the hot sink and the cold sink. The hot sink and the insulating material are used to install the thermoelectric assembly into an appropriately sized opening extending through the exterior of the container or enclosed structure. A thermoelectric device, contained within the layer of insulating material, functions as a heat pump to transfer heat between the cold sink and the hot sink. An electric motor, rotating shaft and propellers are carried by the assembly to assist in the circulation of air to improve the efficiency of the cold sink and the hot sink.

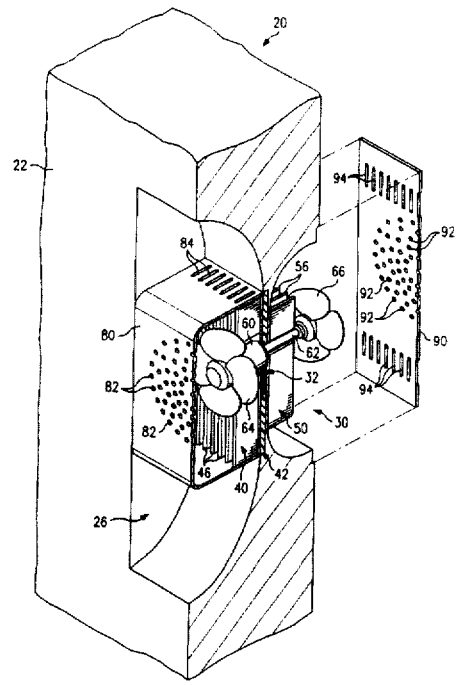

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1 through 15 is confirmed.

Claim 19 is cancelled.

Claims 16 and 18 are determined to be patentable as amended.

Claims 17, 20 and 21 dependent on an amended claim, are determined to be patentable.

16. A modular thermoelectric assembly for installation into a container comprising:
   a thermoelectric device for controlling the temperature within the container;
   the thermoelectric device having a hot side and a cold side;
   a first heat sink and a second heat sink attached to the hot side and the cold side respectively;
   a layer of insulating material disposed between the first heat sink and the second heat sink with the thermoelectric device contained within the insulating material;
   the layer of insulating material and the first heat sink sized to engage an opening in the container for installation of the thermoelectric assembly; and
   an air circulation device for circulating air with respect to the heat sinks comprising a shaft extending through an electric motor *and through the first heat sink and second heat sink* with a propeller on each [and] *end* thereof.

18. A thermoelectric assembly comprising:
   a thermoelectric device for controlling temperature;
   the thermoelectric device having a hot side and a cold side heat transfer surfaces;
   a first heat sink with a first heat transfer surface attached to the hot side and a second heat sink with a second heat transfer surface attached to the cold side;
   a layer of insulating material disposed between the first heat sink and the second heat sink with the thermoelectric device contained within the insulating material; [and]
   an air circulating device simultaneously directing air to circulate in a first flow path directly impinging upon the first heat transfer surface and a second flow path directly impinging upon the second heat transfer surface[.]; *and*
   *the air circulation device having an electrical motor attached to a rotating shaft extending from the electrical motor, at least a portion of the air circulation device extending through a portion of the first heat sink and at least a portion of the second heat sink.*

* * * * *